US010056501B2

(12) United States Patent
Kakefu (10) Patent No.: US 10,056,501 B2
(45) Date of Patent: Aug. 21, 2018

(54) POWER DIODE WITH IMPROVED REVERSE-RECOVERY IMMUNITY

(71) Applicant: FUJI ELECTRIC CO., LTD., Kawasaki (JP)

(72) Inventor: Mitsuhiro Kakefu, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 15/391,170

(22) Filed: Dec. 27, 2016

(65) Prior Publication Data

US 2017/0110596 A1 Apr. 20, 2017

Related U.S. Application Data

(63) Continuation of application No. PCT/JP2016/000155, filed on Jan. 14, 2016.

(30) Foreign Application Priority Data

Jan. 14, 2015 (JP) .................................. 2015-005177

(51) Int. Cl.
*H01L 29/861* (2006.01)
*H01L 29/06* (2006.01)

(52) U.S. Cl.
CPC ........ *H01L 29/861* (2013.01); *H01L 29/0615* (2013.01); *H01L 29/0619* (2013.01)

(58) Field of Classification Search
CPC . H01L 29/861; H01L 29/404; H01L 29/0611; H01L 29/0615; H01L 29/0619;
(Continued)

(56) References Cited

U.S. PATENT DOCUMENTS 6,177,713 B1 * 1/2001 Aono ................... H01L 29/0619
257/170
6,278,140 B1 * 8/2001 Harada ............... H01L 29/0692
257/133
(Continued)

FOREIGN PATENT DOCUMENTS

JP   2005-93550    4/2005
JP   2009-289824   12/2009
(Continued)

OTHER PUBLICATIONS

International Search Report dated Apr. 19, 2016 in corresponding International Application No. PCT/JP2016/000155.
(Continued)

*Primary Examiner* — Tom Thomas
*Assistant Examiner* — Nilufa Rahim (57) ABSTRACT

Provided is a device with improved reverse-recovery immunity of a diode element. The device includes: a first conductivity-type drift layer; a second conductivity-type anode region provided in an upper portion of the drift layer; a second conductivity-type extraction region in contact with and surrounding the anode region; and a second conductivity-type field limiting ring region surrounding and separated from the extraction region at the upper portion of the drift layer, wherein the extraction region has a greater depth than the anode region and the field limiting ring region.

16 Claims, 9 Drawing Sheets

(58) Field of Classification Search
CPC .............. H01L 29/0692; H01L 29/7393; H01L 29/7395; H01L 29/66325; H01L 29/66333; H01L 29/063
See application file for complete search history.

(56) References Cited

U.S. PATENT DOCUMENTS

| | | |
|---|---|---|
| 7,119,379 B2 | 10/2006 | Ninomiya et al. |
| 7,642,599 B2 | 1/2010 | Ninomiya et al. |
| 7,999,347 B2 | 8/2011 | Niwa |
| 8,178,941 B2 | 5/2012 | Kawano et al. |
| 8,716,826 B2 | 5/2014 | Kawano et al. |
| 9,236,460 B2 | 1/2016 | Koyama et al. |
| 2005/0263842 A1* | 12/2005 | Matsui ................ H01L 31/0264 257/453 |
| 2013/0161645 A1* | 6/2013 | Takahashi ............ H01L 29/404 257/77 |
| 2015/0279931 A1* | 10/2015 | Chen .................. H01L 29/7395 257/495 |

FOREIGN PATENT DOCUMENTS

| | | |
|---|---|---|
| JP | 2012-165013 | 8/2012 |
| JP | 2013-179342 | 9/2013 |
| JP | 2014-3271 | 1/2014 |
| JP | 2014-143277 | 8/2014 |

OTHER PUBLICATIONS

English Translation of International Preliminary Search Report on Patentability dated Jul. 27, 2017 in corresponding International Patent Application No. PCT/JP2016/000155.

* cited by examiner

POWER DIODE WITH IMPROVED REVERSE-RECOVERY IMMUNITY

CROSS-REFERENCE TO RELATED APPLICATION

The application is a Continuation of PCT Application No. PCT/JP2016/000155, filed on Jan. 14, 2016, and claims the benefit of priority from the prior Japanese Patent Application No. 2015-005177, filed on Jan. 14, 2015, the entire contents of which are incorporated herein by reference.

TECHNICAL FIELD

The present invention relates to semiconductor devices, and more particularly, to a technology effectively applicable to semiconductor devices including a diode element.

BACKGROUND ART

Power diode elements connected in reverse parallel to switching elements such as IGBT and MOSFET, may cause breakdown depending on used conditions if a time rate of current change (di/dt) is excessive at the time of recovery transition from a forward state to a reverse state. Such power diode elements are therefore typically required to have a large di/dt value in the event of breakdown, namely, to have high destruction immunity during reverse-recovery (hereinafter called "reverse-recovery immunity").

JP2014-003271A discloses that an extraction region having a greater depth than an anode region is formed on the outer side of and in contact with the anode region, so as to relax electric field crowding on an outer curvature portion (outer curved portion) of the extraction region to ensure improved reverse-recovery immunity.

The required reverse recovery value di/dt with regard to the reverse-recovery immunity tends to increase year by year. Such an increase leads to an anxiety about breakdown due to current crowding on an outer edge where the anode electrode is connected to the anode region, or breakdown due to electric field crowding on the outer curvature portion of the extraction region. Thus, there remains a need for further improvement of the reverse-recovery immunity.

SUMMARY OF INVENTION

Technical Problem

An object of the present invention is to provide a technology capable of ensuring improved reverse-recovery immunity of a diode element.

Solution to Problem

In order to achieve the object described above, a semiconductor device according to an aspect of the present invention includes: a first conductivity-type drift layer; a second conductivity-type anode region provided in an upper portion of the drift layer; and a second conductivity-type extraction region in contact with and surrounding the anode region. A second conductivity-type field limiting ring region is surrounding and separated from the extraction region in the upper portion of the drift layer. The extraction region has a greater depth than the anode region and the field limiting ring region.

DESCRIPTION OF EMBODIMENTS

With reference to the Drawings, a semiconductor device according to an embodiment of the present invention will be described in detail below. In the Specification and the appended Drawings, a layer or a region provided with the mark "n" denotes that electrons serve as majority carriers, and a layer or a region provided with the mark "p" denotes that holes serve as the majority carriers. The sign "+" or "−" added to the mark "n" or "p" denotes that a semiconductor region has a higher or lower impurity concentration than a region without the sign "+" or "−" added.

In the following embodiment and the appended Drawings, similar elements are designated by similar reference numerals, and overlapping explanations are not repeated. The dimensions of elements described in the embodiment and illustrated in the appended Drawings are not drawn to scale for clarity or for a better understanding of the embodiment. It should be understood that the present invention is not intended to be limited to the following embodiment while not departing from the scope of the present invention. The use of the directional expressions, such as "above", "below", "upper layer", "lower layer", "upper surface", and "lower surface", is merely a matter of choice for illustration purposes, and is not intended to include any technical meaning. The positional relationship of "above" and "below" may be changed 90 or 180 degrees from the original direction. In view of such a definition of "above" and "below", FIG. 1 and FIG. 3 omit upper layers above an anode electrode for brevity.

<Structure of Semiconductor Device pertaining to Embodiment>

Figure 3:
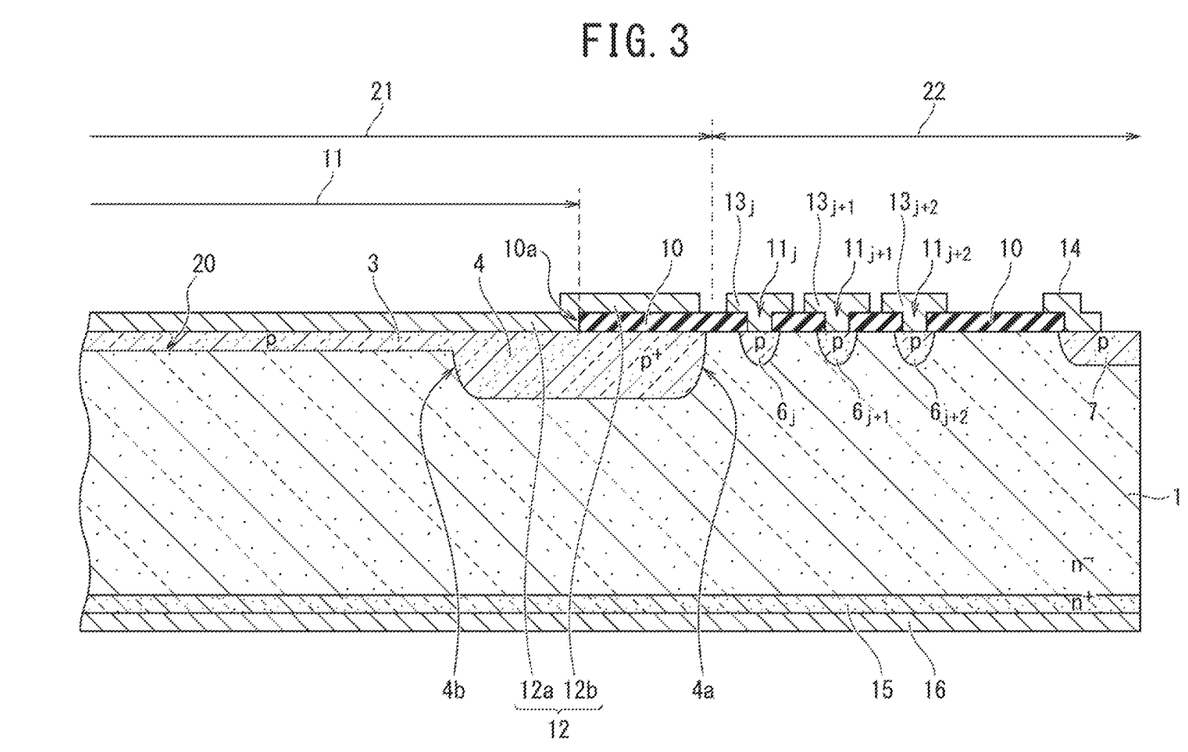
FIG. 3 is a cross-sectional view illustrating a principal part of a cross-sectional structure taken along line II-II of FIG. 1.

As illustrated in FIG. 3, the semiconductor device according to the embodiment of the present invention includes a first conductivity-type (n$^-$-type) drift layer 1 serving as a semiconductor substrate made of single crystalline silicon, for example.

Figure 1:
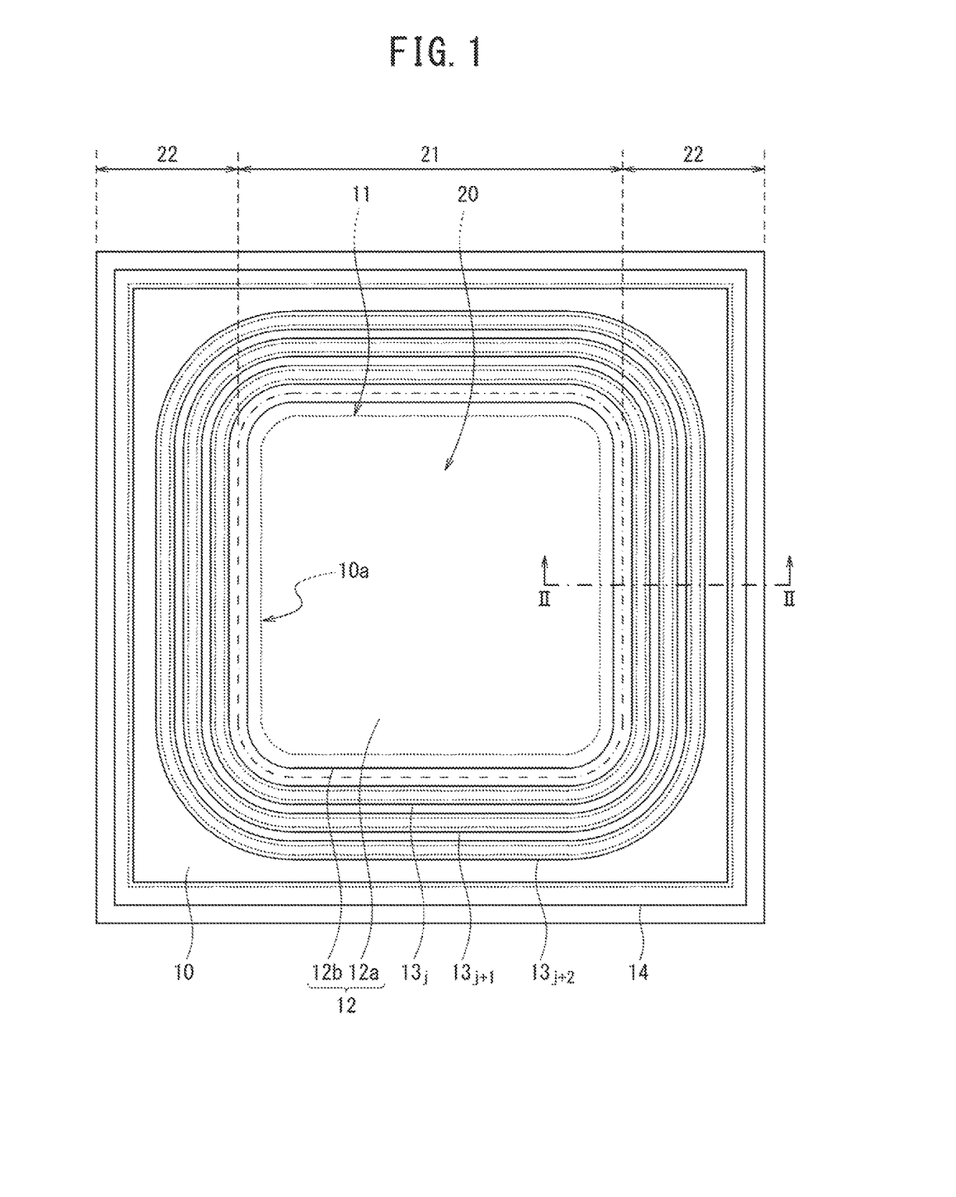
FIG. 1 is a chip layout of a semiconductor device according to an embodiment of the present invention.
Figure 2:
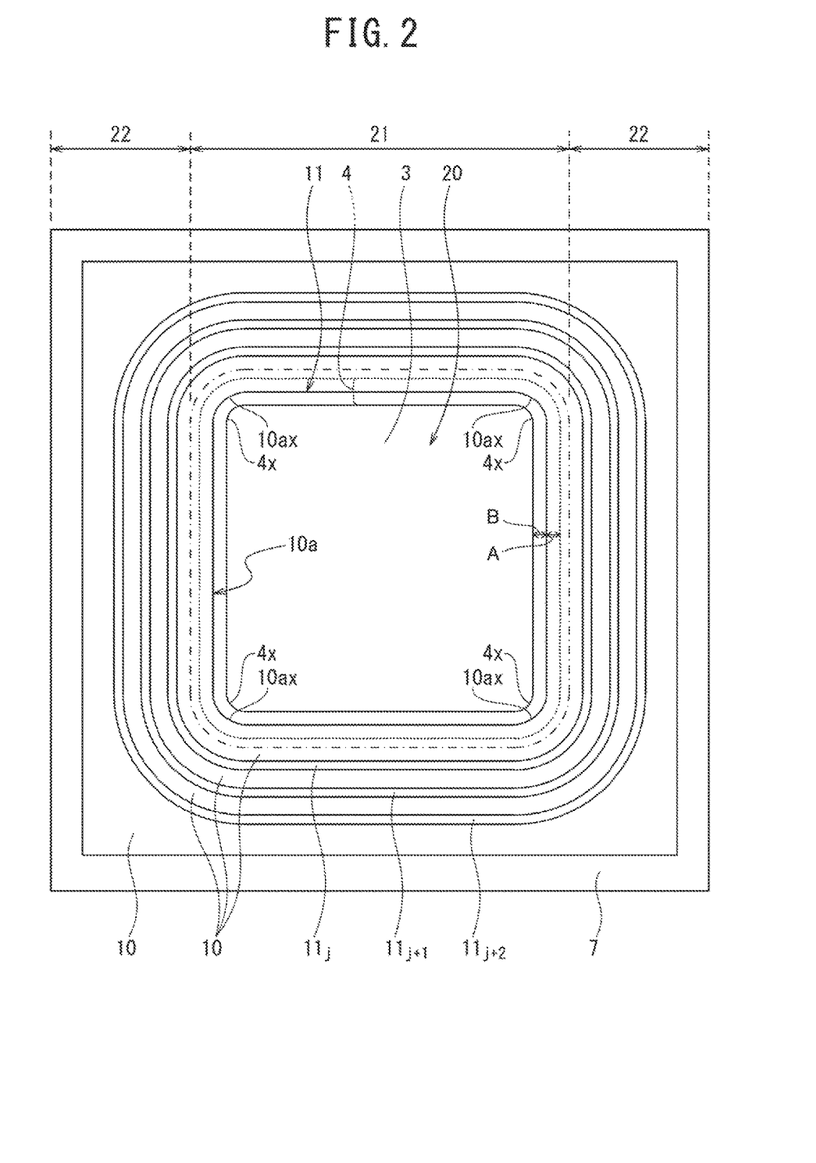
FIG. 2 is a chip layout in which an anode electrode illustrated in FIG. 1 is omitted.

As illustrated in the plan views of FIG. 1 and FIG. 2, the drift layer 1 includes an active-element arrangement area 21 located in the middle, and a contour-termination area (peripheral area) 22 surrounding the active-element arrangement area 21. The active-element arrangement area 21 is provided with a diode element 20. The contour-termination area 22 is provided with, but not limited to the structure illustrated in FIG. 3, triple second conductivity-type (p-type) field limiting ring (FLR) regions $6_j$, $6_{j+1}$, and $6_{j+2}$, which are floating regions, for example. The FLR regions $6_j$, $6_{j+1}$, and $6_{j+2}$ are arranged in parallel and separated from each other.

As illustrated in FIG. 3, the diode element 20 includes the drift layer 1, and a second conductivity-type (p-type) anode region 3 selectively provided at the upper portion on one main surface (hereinafter, referred to as an "upper surface") of the drift layer 1. A second conductivity-type (p-type) extraction region 4 is provided adjacent to the anode region 3 and surrounds the anode region 3 at the upper portion of the drift layer 1. As illustrated in FIG. 2, the extraction region 4 has a ring-shaped flat pattern running along a ring to surround the anode region 3. As illustrated in FIG. 3, the diode element 20 includes a first conductivity-type (n$^+$-type) cathode region 15 spanning from the active-element arrangement area 21 to the contour-termination area 22 on the other main surface (hereinafter, referred to as a "lower surface") of the drift layer 1.

As illustrated in FIG. 1 to FIG. 3, the triple FLR regions $6_j$, $6_{j+1}$, and $6_{j+2}$ are sequentially aligned and separated from the extraction region 4 of the diode element 20, and surround the extraction region 4 on the upper surface of the drift layer 1. The triple FLR regions $6_j$, $6_{j+1}$, and $6_{j+2}$ each have a ring-shaped flat pattern running along a ring to surround the anode region 3 and the extraction region 4.

Figure 4:
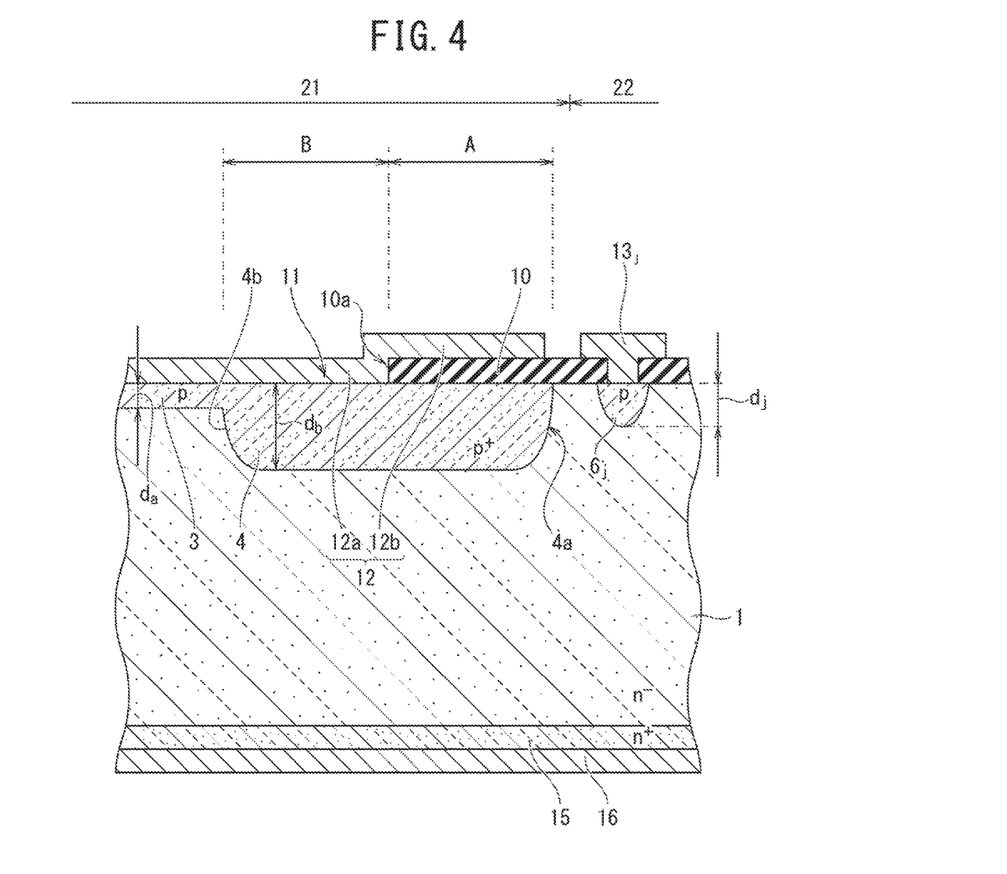
FIG. 4 is a partially-enlarged cross-sectional view of the principal part illustrated in FIG. 3.

As illustrated in FIG. 3 and FIG. 4, the extraction region 4 has a greater depth than the anode region 3 and the triple FLR regions $6_j$, $6_{j+1}$, and $6_{j+2}$. For example, as illustrated in FIG. 4, the depth $d_b$ of the extraction region 4 is approximately 20 μm, the depth $d_a$ of the anode region 3 is approximately 5 μm, and the depth $d_j$ of the respective FLR regions $6_j$, $6_{j+1}$, and $6_{j+2}$ is approximately 9 μm. The depth $d_j$ of the respective FLR regions $6_j$, $6_{j+1}$, and $6_{j+2}$ is preferably, for example, 3 μm or greater and less than 10 μm.

As illustrated in FIG. 3, the semiconductor device according to the embodiment includes an insulating film 10 provided on the upper surface of the drift layer 1, and an anode electrode 12 connected to the anode region 3 through a contact hole 11 penetrating the insulating film 10. The lower surface of the drift layer 1 is provided with a cathode electrode 16 spanning from the active-element arrangement area 21 to the contour-termination area 22. The cathode electrode 16 is electrically and metallurgically connected to the cathode region 15 so as to achieve low ohmic contact resistance therebetween.

As illustrated in FIG. 3, the anode electrode 12 includes an ohmic contact portion 12a, which implements actual ohmic contact with the anode region 3, and an extension portion 12b stretched out from the ohmic contact portion 12a onto the insulating film 10. The extraction region 4 is located immediately below the extension portion 12b of the anode electrode 12. The extraction region 4 is also provided below and across the ohmic contact portion 12a of the anode electrode 12 in contact with the anode region 3 and the extension portion 12b on the insulating film 10. The extraction region 4 is electrically and metallurgically connected to the ohmic contact portion 12a of the anode electrode 12 so as to achieve low ohmic contact resistance therebetween.

As illustrated in FIG. 4, a distance between the edge of an outer curved portion 4a, which is the side surface of the extraction region 4, disposed on the upper surface of the drift layer 1, and the outer edge of the ohmic contact portion 12a of the anode electrode 12, is defined as "A". Namely, the distance A is between the edge 10a of the insulating film 10 (the inner side edge of the contact hole 11), which is the edge of the ohmic contact portion 12a, and the edge of the outer curved portion 4a of the extraction region 4. A distance between the outer edge of the ohmic contact portion 12a (the edge 10a of the insulating film 10) and the edge of an inner curved portion 4b of the extraction region 4 is defined as "B". The extraction region 4 satisfies the relation represented by the following inequation.

$$B > A \qquad (1)$$

Although not clearly illustrated, the semiconductor device according to the embodiment satisfies the relation represented by the following inequation.

$$B \geq A \times 3 \qquad (2)$$

The semiconductor device according to the embodiment has a structure in which the outer curved portion 4a of the extraction region 4 is separated outward from the outer edge of the ohmic contact portion 12a (the edge 10a of the insulating film 10). The semiconductor device also has a structure in which the inner curved portion 4b of the extraction region 4 is separated inward from the outer edge of the ohmic contact portion 12a (the edge 10a of the insulating film 10).

A surface carrier concentration of the anode region 3 is higher than that of the respective FLR regions $6_j$, $6_{j+1}$, and $6_{j+2}$. The surface carrier concentration of the respective FLR regions $6_j$, $6_{j+1}$, and $6_{j+2}$ is higher than that of the extraction region 4. A surface carrier concentration of the anode region 3 is higher than that of the extraction region 4. For example, the surface carrier concentration of the anode region 3 is approximately $1 \times 10^{17}/\text{cm}^3$ to $3 \times 10^{18}/\text{cm}^3$. The surface carrier concentration of the respective FLR regions $6_j$, $6_{j+1}$, and $6_{j+2}$ is approximately $3 \times 10^{16}/\text{cm}^3$ to $1 \times 10^{18}/\text{cm}^3$. The surface carrier concentration of the extraction region 4 is approximately $1 \times 10^{16}/\text{cm}^3$ to $3 \times 10^{17}/\text{cm}^3$.

In the semiconductor device according to the embodiment, the anode region 3, the extraction region 4, and the respective FLR regions $6_j$, $6_{j+1}$, and $6_{j+2}$ are formed such that p-type impurity ions, such as boron ions ($^{11}$B$^+$), are implanted into the respective areas on the upper surface of the drift layer 1 in separate steps. Thereafter, the respective areas are annealed collectively, or in the separate steps, to activate the impurity ions, which are implanted in separate steps.

The implantation of the boron ions for forming the anode region 3 is executed under the conditions of the dose of approximately $7 \times 10^{13}/\text{cm}^2$ to $1 \times 10^{14}/\text{cm}^2$, and the acceleration energy of approximately 100 keV. The implantation of the boron ions for forming the extraction region 4 is executed under the conditions of the dose of approximately $1 \times 10^{15}/\text{cm}^2$ to $5 \times 10^{15}/\text{cm}^2$, and the acceleration energy of approximately 100 keV. The implantation of the boron ions for forming the respective FLR regions $6_j$, $6_{j+1}$, and $6_{j+2}$ is executed under the conditions of the dose of approximately $1 \times 10^{15}/\text{cm}^2$ to $3 \times 10^{15}/\text{cm}^2$, and the acceleration energy of approximately 45 keV.

The respective steps may be conducted in the following order: the extraction region forming step of implanting the ions into the area corresponding to the extraction region 4 and diffusing the ions by annealing; the FLR region forming step of implanting the ions into the area corresponding to the respective FLR regions $6_j$, $6_{j+1}$, and $6_{j+2}$ and diffusing the ions by annealing, after the extraction region forming step; and the anode region forming step of implanting the ions into the area corresponding to the anode region 3 and diffusing the ions by annealing, after the FLR region forming step. The extraction region forming step is executed first, so that the extraction region 4 has a greater diffusion depth than the anode region 3 and the respective FLR regions $6_j$, $6_{j+1}$, and $6_{j+2}$.

As illustrated in FIG. 3, the FLR regions $6_j$, $6_{j+1}$, and $6_{j+2}$ are respectively connected to field limiting ring (FLR) electrodes $13_j$, $13_{j+1}$, and $13_{j+2}$ through field limiting ring (FLR) contact holes $11_j$, $11_{j+1}$, and $11_{j+2}$ penetrating the insulating film 10. The FLR regions $6_j$, $6_{j+1}$, and $6_{j+2}$ are electrically and metallurgically connected to the electrodes $13_j$, $13_{j+1}$, and $13_{j+2}$ so as to achieve low ohmic contact resistance therebetween. As illustrated in FIG. 1 and FIG. 2, the FLR regions $6_j$, $6_{j+1}$, and $6_{j+2}$ and the FLR contact holes $11_j$, $11_{j+1}$, and $11_{j+2}$ each have a ring-shaped flat pattern running along a ring, which surrounds the anode region 3 and the anode electrode 12.

The insulating film 10 is made of a silicon oxide film, for example. The anode electrode 12 and the FLR electrodes $13_j$, $13_{j+1}$, and $13_{j+2}$ are each made of an aluminum (Al) film, or a film of an aluminum alloy such as an aluminum-silicon (Al—Si) alloy, an aluminum-copper (Al—Cu) alloy, or an aluminum-copper-silicon (Al—Cu—Si) alloy, for example. The cathode electrode 16 is made of a gold (Au) film, for example.

As illustrated in FIG. 2 and FIG. 3, a second conductivity-type (p-type) well region 7 is provided at a position surrounding the FLR regions $6_j$, $6_{j+1}$, and $6_{j+2}$, the well region 7 is separated from the FLR regions $6_j$, $6_{j+1}$, and $6_{j+2}$ in and at the upper surface of the drift layer 1. A well electrode 14 is connected to the well region 7, and has a ring-shaped flat pattern running along a ring, which surrounds the FLR regions $6_j$, $6_{j+1}$, and $6_{j+2}$. The well region 7 is electrically and metallurgically connected to the well electrode 14 so as to achieve low ohmic contact resistance therebetween.

<Operation of Semiconductor Device pertaining to Embodiment>

Figure 10:
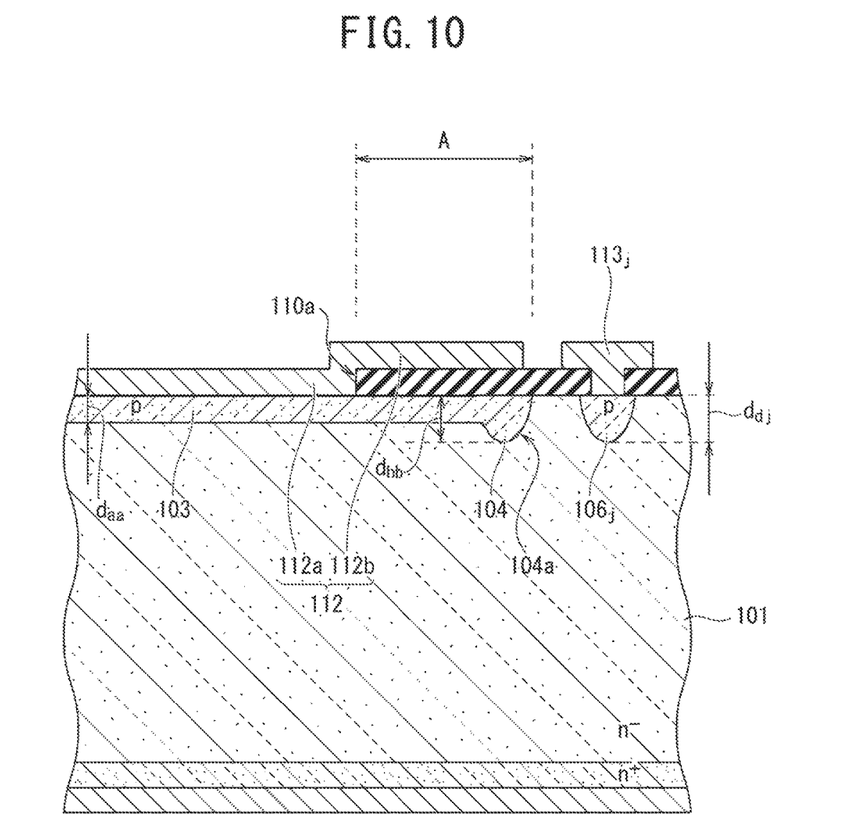
FIG. 10 is a cross-sectional view of a principal part of an earlier semiconductor device.

Next, with reference to FIG. 4, the operation of the semiconductor device according to the embodiment will be described below, referring to FIG. 10, which illustrates an earlier semiconductor device.

The earlier semiconductor device illustrated in FIG. 10 will be explained first. When the diode element is forward-biased so that a potential of the p-type anode region 103 exceeds a diffusion potential (internal potential) of a p-n junction between the anode region 103 and the n⁻-type drift layer 101, holes as minority carriers are injected into the drift layer 101 from the anode region 103. As a result, because of conductivity modulation caused by the concentration of the hole carriers, which are highly injected into the drift layer 101, the concentration of electron carriers (majority carriers) increases. Accordingly, because a forward resistance drops sharply, a forward current increases drastically, and forward characteristics appear as typically illustrated in I-V curves of diodes.

When the diode element is reverse-biased, a depletion layer spreads in the drift layer 101 through recombination of the holes as the minority carriers remaining in the drift layer 101 and the electrons as the majority carriers, and sweeping out the holes toward the anode (the negative electrode). When the depletion layer entirely spreads out the drift layer 101, a current is blocked. The transient process to reach the blocking state is called a reverse recovery. The state of sweeping out the carriers at the time of the reverse recovery is macroscopically referred to as a reverse recovery current, in which a current transitionally flows in spite of the reverse bias. As a reduction rate of the reverse recovery current at the time of forward to reverse transition is greater, a peak current value is greater (also referred to as "a hard recovery").

The holes as the minority carriers crowd on the outer curved portion 104a of the extraction region 104 when the holes are extracted (or swept out) from the anode electrode 112 which is a negative electrode at the time of the reverse bias. This is because an equipotential of an electric field caused by the reverse bias is locally dense at the outer curved portion 104a, and the electric field tends to increase, so that both the current density and the electric field intensity increase. Especially, the concentration increases when the reduction rate of the reverse recovery current at the time of the forward to reverse transition is high.

The diode element may cause breakdown depending on the used conditions if the value di/dt of the current is excessive at the time of the forward to reverse transition during the recovery. Therefore, the diode element is typically required to have a large di/dt value in the event of breakdown, namely, to have high reverse-recovery immunity.

The required reverse recovery value di/dt with regard to the reverse-recovery immunity tends to increase year by year. Such an increase leads to an anxiety about breakdown due to current crowding on the outer edge of the ohmic contact portion 112a where the anode electrode 112 is connected to the anode region 103, or breakdown due to electric field crowding on the outer curvature portion 104a of the extraction region 104. Thus, there remains a need for further improvement of the reverse-recovery immunity.

The semiconductor device according to the embodiment of the present invention illustrated in FIG. 4 includes the FLR regions $6_j$, $6_{j+1}$, and $6_{j+2}$ surrounding the anode region 3 and the extraction region 4 and separated from the extraction region 4 on the main surface of the drift layer 1, as described above. Since the semiconductor device according to the embodiment of the present invention can relax the electric field crowding on the outer curved portion 4a of the extraction region 4 due to the FLR regions $6_j$, $6_{+1}$, and $6_{j+2}$, the reverse-recovery immunity of the diode element 20 can be improved.

The semiconductor device according to the embodiment has a structure in which the extraction region 4 has a greater depth than the anode region 3 and the FLR regions $6_j$, $6_{j+1}$, and $6_{j+2}$, as described above. According to the semiconductor device pertaining to the embodiment, the curvature at the outer curved portion 4a of the extraction region 4 increases as compared with a case in which the extraction region 4 has substantially the same depth as the FLR regions $6_j$, $6_{j+1}$, and $6_{j+2}$ (for example, 9 μm). This further relaxes the electric field crowding on the outer curved portion 4a of the extraction region 4. Accordingly, the reverse-recovery immunity of the diode element 20 can further be improved.

The semiconductor device according to the embodiment has a structure in which the outer edge of the ohmic contact portion 12a of the anode electrode 12 is separated from the outer curved portion 4a of the extraction region 4, as described above. The semiconductor device according to the embodiment can therefore relax the current crowding on the outer edge of the ohmic contact portion 12a of the anode electrode 12. Accordingly, the reverse-recovery immunity of the diode element 20 can further be improved.

<Structure of Extraction Region>

With reference to FIG. 5 to FIG. 7 and FIG. 10A, specific feature of the extraction region 4 will be described below.

Figure 5:
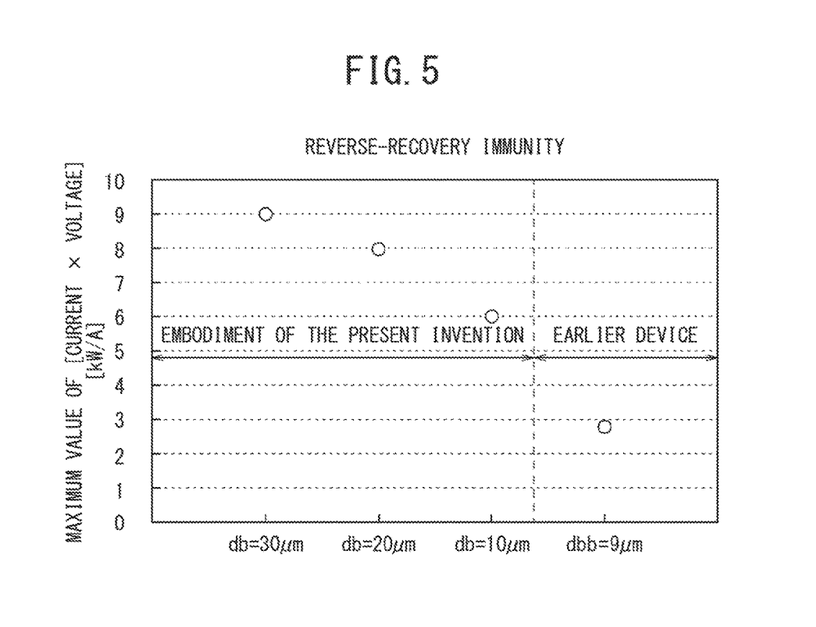
FIG. 5 is a characteristic diagram illustrating a relationship between a depth of an extraction region and a maximum value of [current×voltage] in the semiconductor device according to the embodiment of the present invention.

FIG. 5 is a characteristic diagram illustrating a relationship between the depth $d_b$ of the extraction region 4 and the maximum value of [current×voltage] in the semiconductor device according to the embodiment of the present invention. FIG. 5 also illustrates the characteristics of the earlier semiconductor device.

The data of the semiconductor device according to the embodiment illustrated in FIG. 5 is obtained such that, with reference to FIG. 4, the depth $d_b$ of the extraction region 4 is set to each of 10 μm, 20 μm, and 30 μm, under the conditions that the depth $d_a$ of the anode region 3 is 5 μm, and the width of the extraction region 4 is defined by the distance A of 100 μm and the distance B of 300 μm. The data of the earlier semiconductor device is obtained such that, with reference to FIG. 10, the depth $d_{bb}$ of the extraction region 104 is substantially the same as the depth $d_{dj}$ of the FLR region $106_j$ which is, for example, 9 μm, under the conditions that the depth $d_{aa}$ of the anode region 103 is 5 μm, the width of the extraction region 104 is 20 μm, and the distance A is 300 μm.

Figure 6:
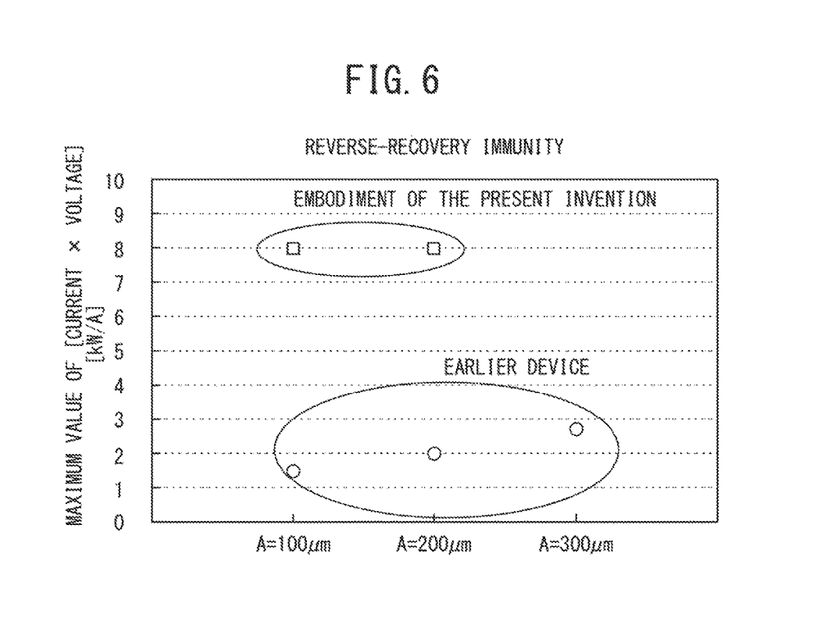
FIG. 6 is a characteristic diagram illustrating a relationship between a distance between an outer curved portion of the extraction region and an outer edge of a connection portion of the anode electrode, and the maximum value of [current×voltage] in the semiconductor device according to the embodiment of the present invention.

FIG. 6 is a characteristic diagram illustrating a relationship between the distance A between the outer curved portion 4a of the extraction region 4 and the outer edge of the ohmic contact portion 12a of the anode electrode 12 (the edge 10a of the insulating film 10), and the maximum value of [current×voltage] in the semiconductor device according to the embodiment of the present invention. FIG. 6 also illustrates the characteristics of the earlier semiconductor device.

The data of the semiconductor device according to the embodiment illustrated in FIG. 6 is obtained such that, with reference to FIG. 4, the width of the extraction region 4 is defined by each set of: the distance A of 100 μm and the distance B of 300 μm; and the distance A of 200 μm and the distance B of 600 μm, under the conditions that the depth $d_a$ of the anode region 3 is 5 μm, and the depth $d_b$ of the extraction region 4 is 20 μm. The data of the earlier semiconductor device is obtained such that, with reference to FIG. 10, the distance A is each of 100 μm, 200 μm, and 300 μm, under the conditions that the depth $d_{aa}$ of the anode region 103 is 5 μm, the width of the extraction region 104 is 20 μm, and the depth $d_{bb}$ of the extraction region 104 is substantially the same as the depth $d_{dj}$ of the FLR region $106_j$ which is, for example, 9 μm.

Figure 7:
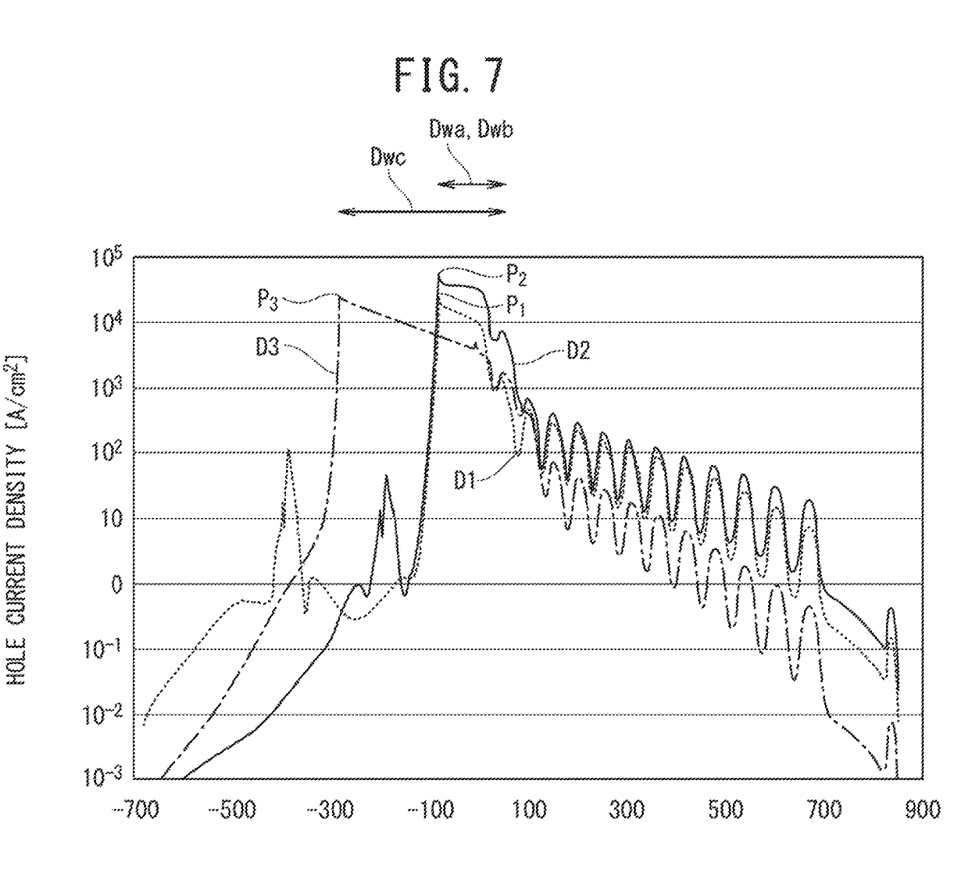
FIG. 7 is a characteristic diagram illustrating hole current density in the semiconductor device according to the embodiment of the present invention.

FIG. 7 is a characteristic diagram illustrating hole current density in the semiconductor device according to the embodiment of the present invention. FIG. 7 also illustrates the characteristics of the earlier semiconductor device. FIG. 7 further illustrates a comparative example.

The data D1 of the semiconductor device according to the embodiment illustrated in FIG. 7 is obtained such that, with reference to FIG. 4, the width of the extraction region 4 is defined by the distance A of 100 μm and the distance B of 100 μm, under the conditions that the depth $d_a$ of the anode region 3 is 5 μm, and the depth $d_b$ of the extraction region 4 is 20 μm. The data D2 of the comparative example is obtained such that, with reference to FIG. 4, the width of the extraction region 4 is defined by the distance A of 100 μm and the distance B of 300 μm, under the conditions that the depth $d_a$ of the anode region 3 is 5 μm, and the depth $d_b$ of the extraction region 4 is 20 μm. The data D3 of the earlier semiconductor device is obtained such that, with reference to FIG. 10, the distance A is 300 μm under the conditions that the depth $d_{aa}$ of the anode region 103 is 5 μm, the width of the extraction region 104 is 20 μm, and the depth $d_{bb}$ of the extraction region 104 is substantially the same as the depth $d_{dj}$ of the FLR region $106_j$ which is, for example, 9 μm.

The hole current density illustrated in FIG. 7 is the data measured on the surface of the semiconductor substrate at the time of the reverse recovery. The point $P_1$ on the data D1 of the semiconductor device according to the embodiment and the point $P_2$ on the data D2 of the comparative example each correspond to the position at the outer edge of the ohmic contact portion 12a of the anode electrode 12 (the edge 10a of the insulating film 10), as illustrated in FIG. 4. The point $P_3$ on the data D3 of the earlier semiconductor device corresponds to the position at the outer edge of the ohmic contact portion 112a of the anode electrode 112 (the edge 110a of the insulating film 110), as illustrated in FIG. 10. The data width $D_{wa}$ of the data D1 and the data width $D_{wb}$ of the data D2 each correspond to the distance A of 100 μm, and the data width $D_{wc}$ of the data D3 corresponds to the distance A of 300 μm.

As illustrated in FIG. 5, the semiconductor device according to the embodiment of the present invention achieves the higher maximum value of [current×voltage] and the higher reverse-recovery immunity than the earlier semiconductor device in each case of $d_b$=30 μm, $d_b$=20 μm, and $d_b$=10 μm. In view of this, the semiconductor device according to the embodiment of the present invention preferably has the depth $d_b$ of the extraction region 4 in the range of from 10 μm to 30 μm.

As illustrated in FIG. 6, the semiconductor device according to the embodiment of the present invention achieves the higher maximum value of [current×voltage] and the higher reverse-recovery immunity than the earlier semiconductor device in each case of the distance A of 100 μm and the distance A of 200 μm. The semiconductor device according to the embodiment of the present invention can achieve the higher reverse-recovery immunity even when the distance A between the outer curved portion 4a of the extraction region 4 and the outer edge of the ohmic contact portion 12a of the anode electrode 12 (the edge 10a of the insulating film 10) is decreased to a third, as compared with the earlier semiconductor device. The decrease of the distance A results in a reduction in chip size. Accordingly, the productivity per semiconductor wafer can be increased to obtain a greater number of chips. The semiconductor device according to the embodiment of the present invention can therefore achieve both a reduction in cost and an improvement of the reverse-recovery immunity of the diode element 20.

In view of FIG. 7, it is preferable that the semiconductor device according to the embodiment of the present invention shall satisfy the relationship represented by Eq. (2). By satisfying Eq. (2), the hole current density multiplied by three corresponds to that of the earlier semiconductor device, as illustrated in FIG. 7.

The semiconductor device according to the embodiment can keep a soft recovery at the time of the reverse recovery when the depth $d_a$ of the anode region 3 is in the range of from 5 μm to 25 μm.

As illustrated in FIG. 3, the edge 10a of the insulating film 10 is located between the extraction region 4 and the ohmic contact portion 12a of the anode electrode 12. As illustrated in FIG. 2, the edge 10a of the insulating film 10 is delineated into a square flat pattern having four arc-like corners 10ax. As illustrated in FIG. 2, the extraction region 4 is implemented by a frame-like flat pattern having four arc-like corners 4x.

Figure 8:
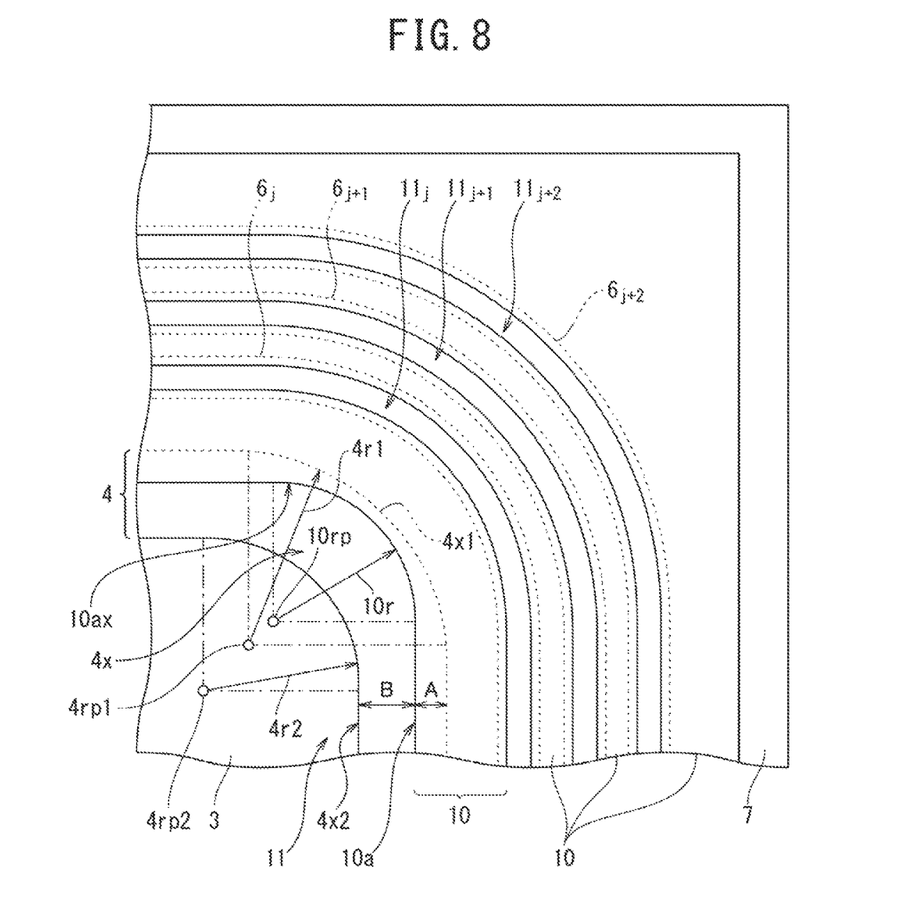
FIG. 8 is a partially-enlarged plan view of the principal part illustrated in FIG. 2.

As illustrated in FIG. 8, the corner 10ax of the edge 10a of the insulating film 10 is implemented by an arc having a radius of curvature 10r based on a center of curvature 10rp. As illustrated in FIG. 8, the outer edge 4x1 at the corner 4x of the extraction region 4 is implemented by an arc having a radius of curvature 4r1 based on a center of curvature 4rp1. The outer edge 4x1 corresponds to the outer curved portion 4a illustrated in FIG. 3. As illustrated in FIG. 8, the inner edge 4x2 at the corner 4x of the extraction region 4 is implemented by an arc having a radius of curvature 4r2 based on a center of curvature 4rp2. The inner edge 4x2 corresponds to the inner curved portion 4b illustrated in FIG. 3.

As illustrated in FIG. 8, the center 4rp1 of the radius of curvature 4r1 and the center 4rp2 of the radius of curvature 4r2 are located on more central side as compared with the center 10rp of the radius of curvature 10r. Namely, the center 4rp1 and the center 4rp2 are located closer to the center of the active-element arrangement area 21 than the center 10rp. The outer edge 4x1 at the corner 4x of the extraction region 4 is delineated into an arc with the radius of curvature 4r1. The center 4rp1 of the outer edge 4x1 is located on the inner side (closer to the center of the active-element arrangement area 21) as compared with the center 10rp of the radius of curvature 10r at the corner 10ax of the edge 10a of the insulating film 10. The radius of curvature 4r1 of the outer edge 4x1 at the corner 4x of the extraction region 4 is greater than the radius of curvature 10r at the corner 10ax. The outer edge 4x1 is located on the outer side of the corner 10ax.

The curvature of the outer edge 4x1 in the plane direction at the corner 4x of the extraction region 4 is increased, as compared with a topology in which the corner is implemented by an arc having a center located at the same position as the center 10rp of the radius of curvature 10r, at the corner 10ax of the edge 10a of the insulating film 10. The semiconductor device according to the embodiment can therefore relax the electric field crowding on the outer edge 4x1 at the corner 4x of the extraction region 4, namely, on the outer curved portion 4a at the corner 4x of the extraction region 4. Accordingly, the reverse-recovery immunity of the diode element 20 can further be improved.

The inner edge 4x2 at the corner 4x of the extraction region 4 is implemented by an arc with the radius of curvature 4r2. The center 4rp2 of the inner edge 4x2 is located on the inner side as compared with the center 10rp of the radius of curvature 10r at the corner 10ax of the edge 10a of the insulating film 10. The radius of curvature 4r2 of the inner edge 4x2 is greater than the radius of curvature 10r at the corner 10ax of the edge 10.

The semiconductor device according to the embodiment therefore has the increased curvature of the inner edge 4x2 in the plane direction at the corner 4x of the extraction region 4 as compared with a topology in which the inner edge 4x2 at the corner 4x is established into an arc having a center of curvature located at the same position as the center 10rp of the radius of curvature 10r at the corner 10ax of the edge 10a of the insulating film 10. Thus, the length B between the inner curved portion 4b of the extraction region 4 and the edge 10a can be greater than the length A between the edge 10a and the outer curved portion 4a at the corner 10ax, as compared with the straight region of the edge 10a. This can relax the current crowding on the inner edge 4x2 at the corner 4x of the extraction region 4, namely, on the outer edge of the ohmic contact portion 12a of the anode electrode 12. Accordingly, the reverse-recovery immunity of the diode element 20 can be improved.

The semiconductor device according to the embodiment may also be obtained such that the boundary between the active-element arrangement area (active area) 21 and the contour-termination area (breakdown-voltage-improving area) 22 is irradiated with helium (He) ions. In particular, as schematically indicated by the broken line in FIG. 9, an irradiation region 8 irradiated with He ions is provided at the boundary (p-n junction) between the extraction region 4 and the drift layer 1. The irradiation region 8 irradiated with He ions is located within the 80% to 120% depth of the extraction region 4, and within the 90% to 110% length of the extraction region 4 (the length is the sum of the distances A and B between the outer curved portion 4a and the inner curved portion 4b). Namely, the irradiation region 8 irradiated with He ions is provided at the boundary (p-n junction) between the drift layer 1 and the extraction region 4 including part of the outer curved portion 4a, the bottom, and part of the inner curved portion 4b.

Figure 9:
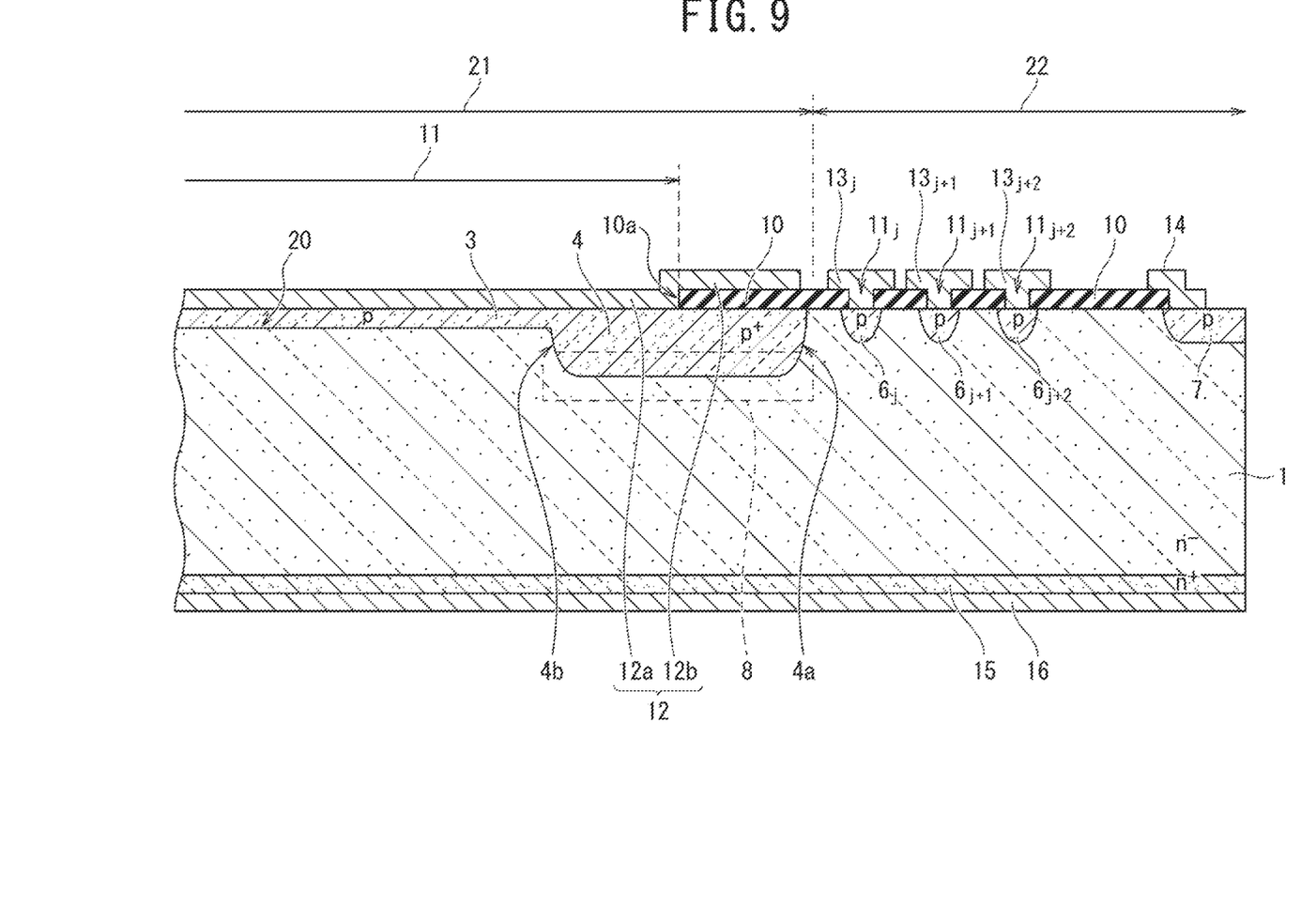
FIG. 9 is a cross-sectional view illustrating a principal part of a cross-sectional structure of a semiconductor device according to another embodiment of the present invention.

The provision of the irradiation region 8 irradiated with He ions, as illustrated in FIG. 9 can prevent holes (current) from flowing toward the anode electrode 12 at the time of the reverse recovery, so as to relax the current crowding on the p-n junction between the extraction region 4 and the drift layer 1 to improve the reverse-recovery immunity. The injection of holes can also be decreased to lead to a soft recovery, so as to suppress a surge voltage. The dose of the He ions irradiated when the irradiation region 8 is formed is $5 \times 10^{11}/\text{cm}^2$ or less. The dose of the He ions set to $5 \times 10^{11}/\text{cm}^2$ or less can reduce current leakage to less than 25 µA.

As described above, the semiconductor device according to the embodiment of the present invention can ensure the improved reverse-recovery immunity of the diode element 20.

While the present embodiment made by the inventor has been described in detail by reference to the embodiment described above, the present invention is not intended to be limited to the embodiment, and various modifications will be apparent to those skilled in the art without departing from the scope of the present invention.

For example, although the active-element arrangement area 21 is provided with one anode region 3 in the embodiment, a plurality of anode regions 3 may be dispersedly provided in the active-element arrangement area 21. Although the extraction region 4 spans from the ohmic contact portion 12a to the extension portion 12b of the anode electrode 12, the extraction region 4 may selectively be provided immediately below the extension portion 12b of the anode electrode 12.

What is claimed is:

1. A semiconductor device comprising:
   a drift layer of a first conductivity type;
   an anode region of a second conductivity type, provided in an upper portion of the drift layer;
   an extraction region of the second conductivity type, in contact with and surrounding the anode region;
   a field limiting ring region of the second conductivity type, surrounding and separated from the extraction region in the upper portion of the drift layer;
   an insulating film provided on the drift layer; and
   an anode electrode including an ohmic contact portion in ohmic contact with the anode region through a contact hole penetrating the insulating film, and an extension portion stretched out from the ohmic contact portion onto the insulating film,
   wherein the extraction region has a greater depth than the anode region and the field limiting ring region,
   an outer curved portion of the extraction region is located outside of an outer edge of the extension portion such that the outer curved portion of the extraction region is closer to a peripheral edge of the drift layer than the
outer edge of the extension portion is to the peripheral
edge of the drift layer,
an edge of the insulating film between the extraction
region and the anode electrode is implemented by a
square flat pattern having first arc-like corners,
the extraction region is implemented by a frame-like flat
pattern having second arc-like corners, the second
arc-like corners corresponding to the first arc-like corners, and
with a distance A from the outer curved portion of the
extraction region and the edge of the insulating film,
and a distance B between the edge of the insulating film
and an inner curved portion of the extraction region,
a relation represented by B>A is satisfied, and
a difference between the distance B and the distance A
at respective corners, among the first arc-like corners
and the second arc-like corners, is greater than a
difference between the distance B and the distance A
at straight regions of the edge of the insulating film.

2. The semiconductor device of claim 1, further comprising a cathode region provided at a lower portion of the drift layer.

3. The semiconductor device of claim 1,
wherein the extraction region is arranged immediately below the extension portion of the anode electrode.

4. The semiconductor device of claim 3, wherein the extraction region spans from the ohmic contact portion to the extension portion, and is connected to the ohmic contact portion.

5. The semiconductor device of claim 4, wherein a depth of the extraction region is in a range of from 10 μm to 30 μm.

6. The semiconductor device of claim 4, wherein:
an outer edge, which is located on an outside relative to a center point within the semiconductor device, at corners, among the second arc-like corners of the extraction region, is implemented by an arc having a radius of curvature of which a center is located on an inner side as compared with a center of a radius of curvature at corners, among the first arc-like corners of the edge of the insulating film.

7. The semiconductor device of claim 6, wherein the radius of curvature of the outer edge at the corners of the extraction region is greater than the radius of curvature at the corners of the edge of the insulating film.

8. The semiconductor device of claim 6, wherein an inner edge at the corners of the extraction region is implemented by an arc having a radius of curvature of which a center is located on an inner side as compared with the center of the radius of curvature at the corners of the edge of the insulating film.

9. The semiconductor device of claim 8, wherein the radius of curvature of the inner edge at the corners of the extraction region is greater than the radius of curvature at the corners of the edge of the insulating film.

10. The semiconductor device of claim 1, wherein a relation represented by B≥A×3 is satisfied.

11. The semiconductor device of claim 1, wherein an irradiation region irradiated with helium ions is provided at a boundary between the extraction region and the drift layer such that the irradiation region is located within an 80% to 120% depth of the extraction region.

12. The semiconductor device of claim 11, wherein the irradiation region is located within a 90% to 110% length of the extraction region.

13. The semiconductor device of claim 11, wherein a dose of the helium ions irradiated is $5\times10^{11}$ /cm$^2$ or less.

14. A semiconductor device comprising:
a drift layer of a first conductivity type;
an anode region of a second conductivity type, provided in an upper portion of the drift layer;
an extraction region of a second conductivity type, in contact with and surrounding the anode region at the upper portion of the drift layer;
an insulating film provided on the drift layer; and
an anode electrode including an ohmic contact portion in ohmic contact with the anode region through a contact hole penetrating the insulating film, and an extension portion stretched out from the ohmic contact portion onto the insulating film,
wherein the extraction region has a greater depth than the anode region, and extends across the ohmic contact portion of the anode electrode and the extension portion,
an edge of the insulating film between the extraction region and the anode electrode is implemented by a square flat pattern having first arc-like corners,
the extraction region is implemented by a frame-like flat pattern having second arc-like corners, the second arc-like corners corresponding to the first arc-like corners,
with a distance A from an outer curved portion of the extraction region and the edge of the insulating film, and a distance B between the edge of the insulating film and an inner curved portion of the extraction region,
a relation represented by B>A is satisfied, and
a difference between the distance B and the distance A at respective corners, among the first arc-like corners and the second arc-like corners, is greater than a difference between the distance B and the distance A at straight regions of the edge of the insulating film, and
the outer curved portion of the extraction region is located outside of an outer edge of the extension portion such that the outer curved portion of the extraction region is closer to a peripheral edge of the drift layer than the outer edge of the extension portion is to the peripheral edge of the drift layer.

15. The semiconductor device of claim 14, wherein a relation represented by B≥A×3 is satisfied.

16. The semiconductor device of claim 14, wherein an irradiation region irradiated with helium ions is provided at a boundary between the extraction region and the drift layer such that the irradiation region is located within an 80% to 120% depth of the extraction region.

* * * * *

UNITED STATES PATENT AND TRADEMARK OFFICE
CERTIFICATE OF CORRECTION

PATENT NO. : 10,056,501 B2  
APPLICATION NO. : 15/391170  
DATED : August 21, 2018  
INVENTOR(S) : Mitsuhiro Kakefu Page 1 of 1

It is certified that error appears in the above-identified patent and that said Letters Patent is hereby corrected as shown below:

In the Claims

Column 12, Line 8:
In Claim 13, delete "$5\times10^{11}$ /cm$^2$" and insert -- $5\times10^{11}$/cm$^2$ --, therefore.

Signed and Sealed this
Sixteenth Day of October, 2018

Andrei Iancu
*Director of the United States Patent and Trademark Office*